(12) United States Patent
Jung

(10) Patent No.: US 9,824,643 B2
(45) Date of Patent: Nov. 21, 2017

(54) ARRAY SUBSTRATE, PIXEL DRIVING METHOD THEREOF AND DISPLAY DEVICE

(71) Applicant: BOE TECHNOLOGY GROUP CO., LTD., Beijing (CN)

(72) Inventor: Chulgyu Jung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/353,934

(22) PCT Filed: Dec. 12, 2013

(86) PCT No.: PCT/CN2013/089224
§ 371 (c)(1),
(2) Date: Apr. 24, 2014

(87) PCT Pub. No.: WO2015/027614
PCT Pub. Date: Mar. 5, 2015

(65) Prior Publication Data
US 2015/0213768 A1 Jul. 30, 2015

(30) Foreign Application Priority Data

Aug. 30, 2013 (CN) .......................... 2013 1 0389811

(51) Int. Cl.
*G09G 3/36* (2006.01)
*G02F 1/1333* (2006.01)
(Continued)

(52) U.S. Cl.
CPC ......... *G09G 3/3607* (2013.01); *G02F 1/1333* (2013.01); *G02F 1/136286* (2013.01);
(Continued)

(58) Field of Classification Search
None
See application file for complete search history.

(56) References Cited

U.S. PATENT DOCUMENTS 8,284,340 B2 * 10/2012 Park et al. ....................... 349/54
9,225,972 B2 * 12/2015 Payne ................ H04N 13/0413
(Continued)

FOREIGN PATENT DOCUMENTS

CN 102981339 A 3/2013
CN 103439824 A 12/2013
(Continued)

OTHER PUBLICATIONS

International Search Report and Written Opinion dated Jul. 18, 2014 regarding PCT/CN2013/089224. Translation provided by Dragon Intellectual Property Law Firm.
(Continued)

*Primary Examiner* — Larry Sternbane
*Assistant Examiner* — Nathan Brittingham
(74) *Attorney, Agent, or Firm* — Harness, Dickey & Pierce, P.L.C.

(57) ABSTRACT

Embodiments of the present invention provides an array substrate, a pixel driving method, and a display device, and the array substrate is provided with a first pixel unit set used to display a first image, and pixel units in the first pixel unit set are coupled to a first gate line set in the plurality of gate lines; a second pixel unit set configured to display a second image, and pixel units in the second pixel unit set are coupled to a second gate line set in the plurality of gate lines; the pixel units in the first pixel unit set and the pixel units in the second pixel unit set are alternately provided.

9 Claims, 4 Drawing Sheets

(51) Int. Cl.
    *G09G 3/32*         (2016.01)
    *G02F 1/1362*     (2006.01)
    *G09G 3/00*         (2006.01)
    *H04N 13/04*      (2006.01)
    *H01L 27/32*      (2006.01)
    *G09G 3/3225*     (2016.01)

(52) U.S. Cl.
    CPC ............... *G09G 3/003* (2013.01); *G09G 3/32* (2013.01); *G09G 3/3225* (2013.01); *G09G 3/3659* (2013.01); *H01L 27/3218* (2013.01); *H04N 13/0422* (2013.01); *H04N 13/0497* (2013.01); *G09G 2300/0426* (2013.01); *G09G 2300/0452* (2013.01); *G09G 2300/0478* (2013.01); *G09G 2300/0804* (2013.01); *G09G 2320/02* (2013.01); *G09G 2320/0261* (2013.01); *G09G 2320/0686* (2013.01); *G09G 2330/021* (2013.01); *G09G 2330/023* (2013.01); *G09G 2330/06* (2013.01)

(56) References Cited

U.S. PATENT DOCUMENTS

| | | | |
|---|---|---|---|
| 2009/0179879 A1* | 7/2009 | Nozawa | G02B 27/2214 345/204 |
| 2012/0075545 A1* | 3/2012 | Sato | 349/42 |
| 2012/0293496 A1* | 11/2012 | Park et al. | 345/419 |
| 2012/0313905 A1* | 12/2012 | Kang et al. | 345/204 |
| 2013/0027621 A1 | 1/2013 | Lee et al. | |
| 2014/0085441 A1* | 3/2014 | Li | G02B 27/26 348/58 |
| 2014/0291683 A1* | 10/2014 | Cho | H01L 29/66742 257/59 |
| 2014/0347362 A1* | 11/2014 | Maleki | H04N 13/0029 345/427 |
| 2015/0213768 A1* | 7/2015 | Jung | G02F 1/1333 345/694 |

FOREIGN PATENT DOCUMENTS

| | | |
|---|---|---|
| JP | 2004271617 A | 9/2004 |
| JP | 2011227476 A | 11/2011 |

OTHER PUBLICATIONS

Chinese Office Action dated Jun. 2, 2015 regarding Chinese Application No. 201310389811.0. Translation provided by Dragon Intellectual Property Law Firm.

Second Office Action regarding Chinese application No. 201310389811.0, dated Nov. 16, 2015. Translation provided by Dragon Intellectual Property Law Firm.

* cited by examiner

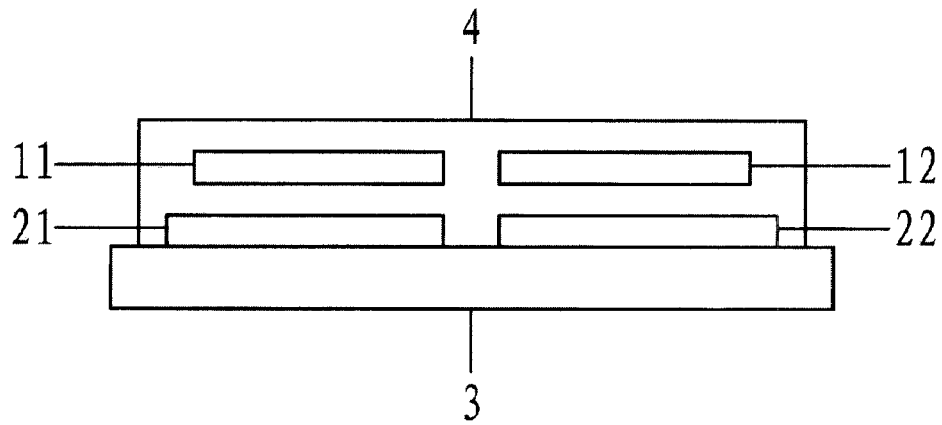

Fig. 5

| In a first time unit, driving pixel units in a first pixel unit set to display a corresponding picture image, and controlling pixel units in a secondpixel unit set to display no picture image or driving the pixel units in the second pixel unit set to display a dark-tone primary color | ⟵ 61 |

↓

| In a second time unit, driving the pixel units in the second pixel unit set to display a corresponding picture image, and controlling pixel units in the first pixel unit set to display no picture image or driving pixel units in the first pixel unit set to display a dark-tone primary color | ⟵ 62 |

Fig. 6

ARRAY SUBSTRATE, PIXEL DRIVING METHOD THEREOF AND DISPLAY DEVICE

CROSS-REFERENCE TO RELATED APPLICATION

This application is the U.S. national phase of PCT Application No. PCT/CN2013/089224 filed on Dec. 12, 2013, which claims priority to Chinese Patent Application No. 201310389811.0 filed on Aug. 30, 2013, the disclosures of which are incorporated in their entirety by reference herein.

TECHNICAL FIELD

The present invention relates to the field of display technology, in particular to an array substrate, a pixel driving method, and a display device.

BACKGROUND

A Liquid Crystal Display (LCD) includes a liquid crystal display panel specifically provided with a plurality of gate lines, a plurality of data lines, pixel units formed at the crossed region of the gate lines and the data lines, a time sequence controller, a gate electrode driving unit for outputting gate electrode signals to the gate lines i.e. an X axis IC, and a source electrode driving unit for outputting data signals to the data lines i.e. a Y axis IC, and other devices.

In the prior art, when a LCD displays an image, as shown in FIG. 1, the plurality of pixel units existing in the LCD, which are driven by the driving signals inputted from the corresponding grid line, are sequentially driven to emit light and display corresponding images according to the method shown by an arrow, thereby to make the LCD display the image.

At present, in order to make a LCD and an organic light-emitting diodes (OLED) display device to achieve a 3D image display, higher driving frequencies are needed, such as 120 Hz, 240 Hz, etc. With the rise of the driving frequency, power consumption of an existing display device also rises, and the problem of electro magnetic interference (EMI) also happens to the display devices.

SUMMARY

An embodiment of the present invention provides an array substrate, a pixel driving method, and a display device, so as to effectively reduce the driving frequency of the display device, and to reduce the power consumption of the display device.

An embodiment of the present invention provides an array substrate, comprising a plurality of pixel units and a plurality of gate line for providing driving signals to the pixel units;
the plurality of pixel units comprising:
a first pixel unit set configured to display a first image, pixel units in the first pixel unit set are coupled to a first gate line set in the plurality of gate lines; and
a second pixel unit set configured to display a second image, pixel units in the second pixel unit set are coupled to a second gate line set in the plurality of gate lines;
the pixel units comprised in the first pixel unit set and the pixel units in the second pixel unit set are alternately provided.

Alternatively, when pixel units of one pixel unit set of the first pixel unit set and the second pixel unit set display an image, pixel units of the other pixel unit set display no image or display a dark-tone primary color.

Alternatively, the primary color is black.

Alternatively, the pixel units of the first pixel unit set and the pixel units of the second pixel unit set are alternately provided in a horizontal direction and/or a vertical direction.

Alternatively, gate lines in the first gate line set and gate lines in the second gate line set are formed on an identical layer and alternately provided.

Alternatively, gate lines in the first gate line set and gate lines in the second gate line set are formed on different layers.

An embodiment of the present invention further provides a pixel driving method, comprising:
in a first time unit, driving pixel units in a first pixel unit set to display a corresponding first image, and controlling pixel units in a second pixel unit set to display no image or driving the pixel units in the second pixel unit set to display a dark-tone primary color;
in a second time unit, driving the pixel units in the second pixel unit set to display a corresponding second image, and controlling pixel units in the first pixel unit set to display no image or driving pixel units in the first pixel unit set to display a dark-tone primary color.

Alternatively, the primary color is black.

Alternatively, the time unit is a data frame.

Alternatively, the first image is a left-eye image in a 3D picture; and
the second image is a right-eye image in the 3D picture.

Alternatively, the first image is a right-eye image in a 3D picture; and the second image is a left-eye image in the 3D picture.

An embodiment of the present invention further provides a display device, comprising the array substrate provided in the preceding embodiments.

Alternatively, the display device further comprises at least one gate line driver chip, which is configured to control gate lines to drive the pixel units in the first pixel unit set and the pixel units in the second pixel unit set to alternately display images.

Alternatively, the alternately displayed images are the right-eye image in the 3D picture and the left-eye image in the 3D picture.

According to the above description, embodiments of the present invention provides an array substrate, a pixel driving method and a display device, and the array substrate is provided with a first pixel unit set configured to display a first image, and the pixel units in the first pixel unit set are coupled to a first gate line set in the plurality of gate lines; a second pixel unit set configured to display a second image, pixel units in the second pixel unit set are coupled to a second gate line set in the plurality of gate lines; the pixel units in the first pixel unit set and the pixel units in the second pixel unit set are alternately provided. The embodiments of the present invention utilize a limited number of pixel units in the array substrate to display corresponding images, reducing the power consumption of the display device by reducing driving frequency, thereby effectively improving the problem of EMI.

BRIEF DESCRIPTION OF THE DRAWINGS

FIG. 5 is a sectional schematic view showing an array substrate according to an embodiment of the present invention;

FIG. 6 is a flow chart showing a pixel driving method according to an embodiment of the present invention.

DETAILED DESCRIPTION

Figure 1:
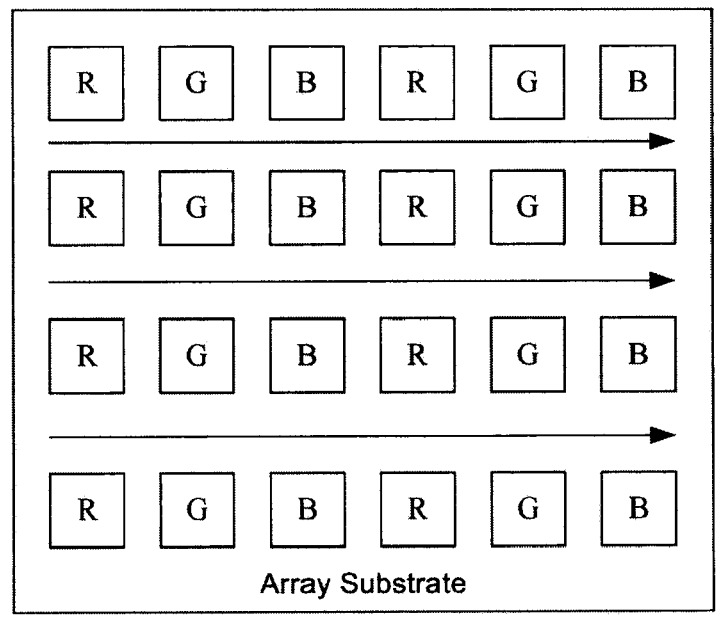
FIG. 1 is a schematic view showing an array substrate in the prior art.

To make the objects, the technical solutions and the advantages of the present invention more apparent, the technical solutions of present invention are clearly and completely described hereinafter in conjunction with the drawings as well as the embodiments. Obviously, the following embodiments are merely a part of, rather than all, the embodiments of the present invention. Based on these embodiments, it is able for a person skilled in the art to obtain other embodiments, which also fall within the scope of the present invention.

Unless otherwise defined, the technical terms and scientific terms herein have general meanings which may be understood by those of ordinary skill in the art. In the specification and the claims of the present application, "first", "second", and similar terms do not indicate any order, quantity, or importance, but are only used to distinguish between different components. Similarly, "a" or "an" and other similar words do not mean quantitative restrictions, but rather indicate at least one. "couple" or "connect" and other similar words are not limited to physical or mechanical connections, but can include electrical connections, either directly or indirectly. "up", "down", "left", "right" and the like are only used to indicate the relative positional relations, and when the absolute position of the object are changed, the relative positional relations will also be changed accordingly.

An embodiment of the present invention provides an array substrate, comprising a plurality of pixel units and a plurality of gate lines used for supplying driving signals to the plurality of pixel units;

the plurality of pixel units comprising:

a first pixel unit set configured to display a first image, pixel units in the first pixel unit set are coupled to a first gate line set in the plurality of gate lines; and a second pixel unit set configured to display a second image, pixel units in the second pixel unit set are coupled to a second gate line set in the plurality of gate lines;

the pixel units in the first pixel unit set and the pixel units in the second pixel unit set are alternately provided.

The array substrate provided in the embodiment of the present invention utilizes the preset number of pixel units to display the required image, thereby reducing the power consumption of a display device by reducing the driving frequency.

In one embodiment of the present invention, when pixel units in one pixel unit set of the first pixel unit set and the second pixel unit set display an image, pixel units in the other pixel unit set may not display the image.

In an embodiment, the first image may be a left-eye image in a 3D picture, and the second image may be a right-eye image in the 3D picture; or the first image may be the right-eye image in the 3D picture, and the second image may be the left-eye image in the 3D picture.

Corresponding to the 3D picture in this way, the first pixel unit set and the second pixel unit set in the array substrate provided in the embodiment of the present invention alternately display the left-eye image and the right-eye image in the 3D picture according to a preset time unit such as a data frame, thereby on the basis of reducing the driving frequency, to ensure that the display device displays a complete 3D image data.

In another embodiment, in order to improve 3D ghost phenomena, the technical solution provided in an embodiment of the present invention, may achieve that when pixel units in one pixel unit set of the first pixel unit set and the second pixel unit set display a corresponding image, pixel units of the other pixel unit set display a dark-tone primary color, such as black, thereby effectively improving 3D ghost phenomena.

Figure 2:
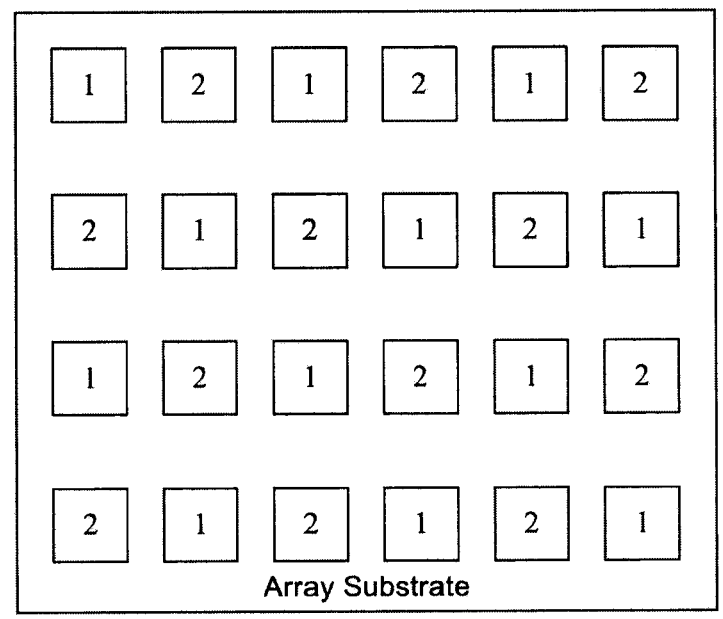
FIG. 2 is a schematic view showing an array substrate according to one embodiment of the present invention.

In one embodiment, the pixel units in the first pixel unit set and the pixel units in the second pixel unit set which are alternately provided may be alternately provided in a horizontal or vertical direction, or may be alternately provided both in the horizontal direction and the vertical direction as shown in FIG. 2. In FIG. 2, the pixel units designated as 1 may be the pixel units in the first pixel unit set; and the pixel units designated as 2 may be the pixel units in the second pixel unit set.

The pixel units in the embodiment of the present invention may also be applied to display corresponding primary colors, such as R, Q, B.

In one embodiment, the type of the thin film transistor (TFT) in the array substrate provided in the embodiment of the present invention may be a top-gate type, and the array substrate is a top-gate array substrate. The array substrate provided in an embodiment of the present invention comprises a glass substrate, a gate electrode layer, a gate insulating layer, a semiconductor layer, a source/drain metal layer, a passivation layer, a transparent electrode layer, and other necessary layers for the array substrate to achieve its function.

Figure 3:
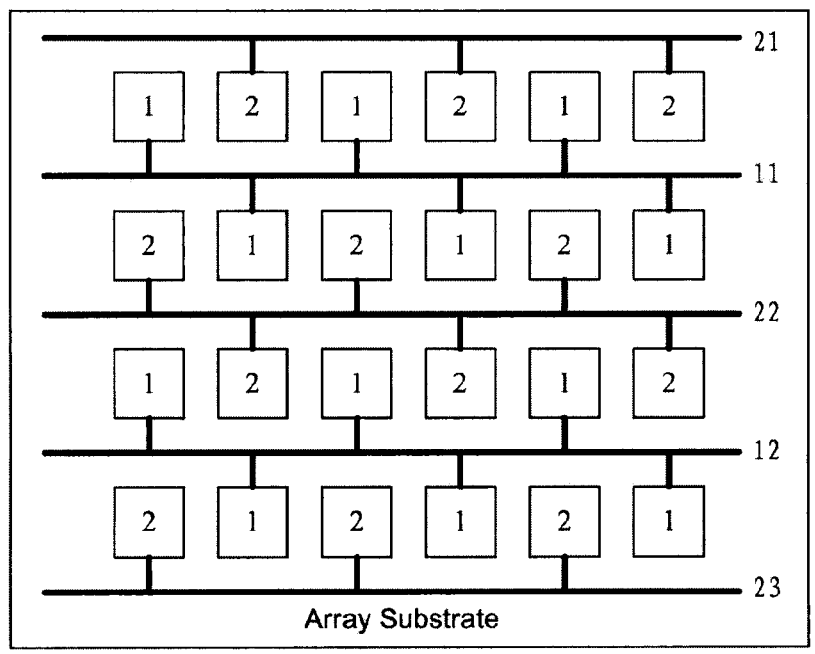
FIG. 3 is a schematic view showing an array substrate according to another embodiment of the present invention.

In the embodiment of the present invention, in order to ensure that the pixel units in the first pixel unit set and the pixel units in the second pixel unit set are alternately driven to display the corresponding images in the sequence of time unit. In a specific embodiment, the structure arrangement between the gate lines in the first gate line set and the gate lines in the second gate line set may be as shown in FIG. 3.

That is, the gate lines in the first gate line set and the gate lines in the second gate line set may be formed on an identical layer and alternately provided. In FIG. 3, the gate lines designated by 1 as the first digit may be the gate lines in the first gate line set, such as 11, 12; while the gate lines designated by 2 as the first digit may be the gate lines in the second gate line set, such as 21, 22, 23, and so on.

Figure 4:
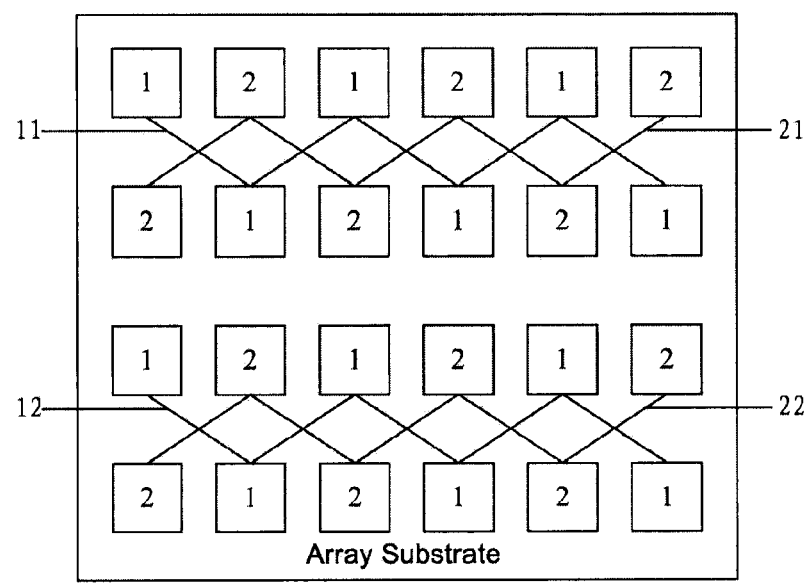
FIG. 4 is a schematic view showing an array substrate according to yet another embodiment of the present invention.

While in another specific embodiment, as shown in FIG. 4 and FIG. 5, the gate lines in the first gate line set and the gate lines in the second gate line set may be formed in different layers. FIG. 4 may be a top view of the array substrate provided in an embodiment of the present invention, and FIG. 5 may be a sectional view of the array substrate provided in an embodiment of the present invention, wherein the reference numeral 3 indicates a glass substrate, and the reference numeral 4 may indicate a gate insulating layer, and an insulating layer is provided between the first gate line unit set and the second gate line unit set, which may be a gate insulating layer. Similarly, as shown in FIG. 4 and FIG. 5, the gate lines designated by 1 as the first digit may be the gate lines in the first gate line set, such as 11, 12 and so on; while the gate lines designated by 2 as the first digit may be the gate lines in the second gate line set, such as 21, 22 and so on.

It is to be noted that, the technical solution shown in the drawings of the embodiment of the present invention is only used to facilitate understanding of the technical solution provided by the present invention, while it is not to limit the content of the technical solution provided in an embodiment of the present invention.

An embodiment of the present invention further provides a pixel driving method, as shown in FIG. 6, the method comprising:

Step 61, in a first time unit, driving pixel units in a first pixel unit set to display a corresponding image, and controlling pixel units in a second pixel unit set to display no image or driving the pixel units in the second pixel unit set to display a dark-tone primary color;

Step 62, in a second time unit, driving pixel units in the second pixel unit set to display the corresponding image, and controlling pixel units in the first pixel unit set to display no image or driving pixel units in the first pixel unit set to display a dark-tone primary color.

The pixel driving method provided in an embodiment of the present invention utilizes a limited number of pixel units to display required images, thereby reducing the power consumption of a display device by reducing driving frequency.

The time unit in the embodiment of the present invention may be a data frame and the like.

Hereinafter, by taking the application of the pixel driving method in an embodiment of the present invention to the array substrates as shown in FIG. 4, 5 as an example, a specific implementation procedure of the pixel driving method provided in an embodiment of the present invention is described.

In the embodiment, the time unit may be a data frame, and one frame may be 1/120 second.

Figure 7:
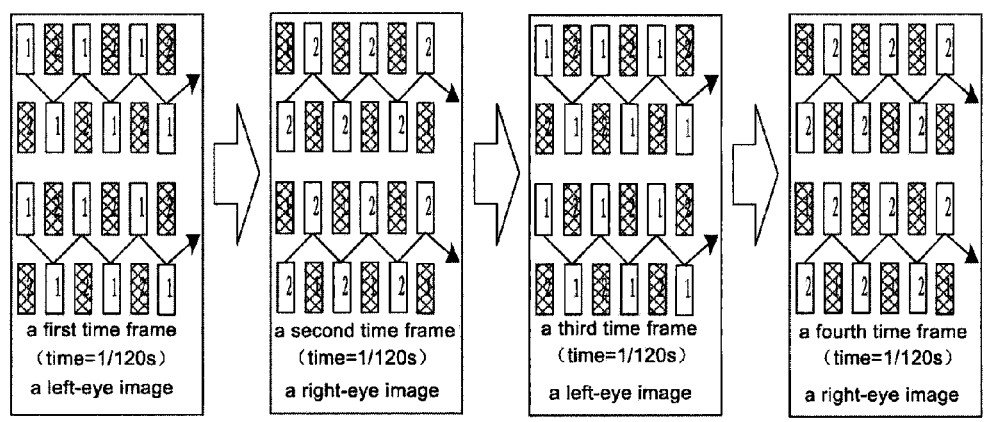
FIG. 7 is a schematic view showing the implementation of driving pixels in the array substrate according to the pixel driving method as shown in FIG. 6

As shown in FIG. 7, the specific procedure may comprises that in a first data frame, the pixel units in the first pixel unit set, under the control of driving signals, display a corresponding image, such as a left-eye image in a 3D picture.

To be specific, the pixel units in the first pixel unit set may be driven sequentially in the direction as shown by the arrows in FIG. 7, and the direction of the arrows shows a path of coupling gate lines to pixel units.

At this time, pixel units in the second pixel unit set are controlled to display no image or driven by the driving signals to display a dark-tone primary color, such as black.

In the second data frame, the pixel units in the second pixel unit set are driven by the driving signals to display the corresponding images, such as a right-eye image in a 3D picture.

Similarly, the pixel units in the second pixel unit set may be driven sequentially in the direction as shown by the arrows in FIG. 7.

At this time, pixel units in the first pixel unit set are controlled to display no image or driven by the driving signals to display a dark-tone primary color.

In the third data frame, the pixel units in the first pixel unit are driven again to display corresponding images, such as a left-eye image in the 3D picture. In the fourth data frame, the pixel units in the second pixel unit are driven again to display corresponding images, such as a right-eye image in the 3D picture, and the subsequent data frames are displayed in the same manner, i.e. by taking a data frame and the like as a time unit, the pixel units in the first pixel unit set and the second pixel unit set are alternately driven to display corresponding images. Thus images such as 3D images are completely displayed.

It is to be noted that, the pixel units in the shadow as shown in FIG. 7 of the embodiment of the present invention are used to represent that the pixel units are controlled to display no image or are driven to display a dark-tone primary color.

As can be seen, the pixel driving method provided in the embodiment of the present invention utilizes a preset number of pixel units to display the required images, i.e. by way of a serrated described driving method, thereby reducing the power consumption of a display device by reducing the driving frequency.

Based on the array substrate provided in an embodiment of the present invention, an embodiment of the present invention further provides a display device, and the display device may comprise the array substrate provided in the embodiment of the present invention.

The display device may be a liquid crystal panel, a liquid crystal television, a liquid crystal display, an OLED panel, an OLED display, a plasma display, or an electronic paper and so on.

Alternatively, the display device comprises at least one gate line driving chip, which is configured to control the corresponding gate lines to drive the pixel units in the first pixel unit set and the pixel units in the second pixel unit set to alternately display images.

It may be appreciated that, embodiments of the present invention provide an array substrate, a pixel driving method and a display device, and the array substrate is provided with a first pixel unit set used to display a first image, and pixel units in the first pixel unit set are coupled to a first gate line set in the plurality of gate lines; and a second pixel unit set used to display a second image, and pixel units in the second pixel unit set are coupled to a second gate line set in the plurality of gate lines. The pixel units in the first pixel unit set and the pixel units in the second pixel unit set are alternately provided. The embodiment of the present invention provides technical solutions that utilize a limited number of pixel units in the array substrate to display corresponding images, reducing the power consumption of the device by reducing the driving frequency, thereby effectively improving the problem of EMI.

The above are merely the preferred embodiments of the present invention, but the present invention are not limited thereto. It should be noted that, those of ordinary skills in the art may further make improvements and modifications without departing from the principle of the present invention, and these improvements and modifications shall also be considered as the scope of the present invention.

What is claimed is:

1. An array substrate, comprising a plurality of pixel units and a plurality of gate lines used for supplying driving signals directly to the plurality of pixel units, the plurality of pixel units comprising:

a left-eye image pixel unit set configured to display a left-eye image, pixel units in the left-eye image pixel unit set are directly coupled to a first gate line set in the plurality of gate lines; and a right-eye image pixel unit set configured to display a right-eye image, pixel units in the right-eye image pixel unit set are directly coupled to a second gate line set in the plurality of gate lines, the left-eye image pixel unit set being configured to display left-eye images and not right-eye images, the right-eye image pixel unit set being configured to display right-eye images and not left-eye image images; and the pixel units in the left-eye image pixel unit set and the pixel units in the right-eye image pixel unit set are alternately provided both in a horizontal direction and a vertical direction, wherein gate lines in the first gate line set and gate lines in the second gate line set are formed on different layers.

2. The array substrate according to claim 1, wherein when pixel units of one pixel unit set of the left-eye image pixel unit set and the right-eye image pixel unit set display an image, pixel units of the other pixel unit set display a dark-tone primary color.

3. The array substrate according to claim 2, wherein the primary color is black.

4. A pixel driving method, comprising:

driving pixel units in a left-eye image pixel unit set to display a left-eye image and pixel units in a right-eye image pixel unit set to display a right-eye image alternately, the left-eye image pixel unit set displaying left-eye images and not right-eye images, pixel units in the left-eye image pixel unit set being directly coupled to a first gate line set in a plurality of gate lines, pixel units in the right-eye image pixel unit set being directly coupled to a second gate line set in the plurality of gate lines, and the right-eye image pixel unit set displaying right-eye images and not left-eye images;

wherein when the pixel units in the left-eye image pixel unit set are driven to display the left-eye image, the pixel units in the right-eye image pixel unit set are driven to display a dark-tone primary color;

when the pixel units in the right-eye image pixel unit set are driven to display the right-eye image, the pixel units in the left-eye image pixel unit set are driven to display a dark-tone primary color;

wherein the pixel units in the left-eye image pixel unit set and the pixel units in the right-eye image pixel unit set are alternately provided both in a horizontal direction and a vertical direction, wherein gate lines in the first gate line set and gate lines in the second gate line set are formed on different layers.

5. The pixel driving method according to claim 4, wherein the primary color is black.

6. The pixel driving method according to claim 4, wherein a time unit is a data frame.

7. A display device, comprising the array substrates according to claim 1.

8. The display device according to claim 7, further comprising at least one gate line driver chip, which is configured to control gate lines to drive the pixel units in the left-eye image pixel unit set and the pixel units in the right-eye image pixel unit set to alternately display the left-eye image and the right-eye images in a three dimension picture.

9. The pixel driving method according to claim 5, wherein a time unit is a data frame.

* * * * *